United States Patent [19]

Baily

[11] Patent Number: 5,376,920
[45] Date of Patent: Dec. 27, 1994

[54] POWER FAIL DETECTION CIRCUIT

[75] Inventor: Gregory F. Baily, Cathays, United Kingdom

[73] Assignee: Huntleigh Technology PLC, Bedfordshire, United Kingdom

[21] Appl. No.: 972,482

[22] PCT Filed: Jun. 12, 1992

[86] PCT No.: PCT/GB92/01058
§ 371 Date: Apr. 14, 1993
§ 102(e) Date: Apr. 14, 1993

[87] PCT Pub. No.: WO92/22949
PCT Pub. Date: Dec. 23, 1992

[30] Foreign Application Priority Data

Jun. 14, 1991 [GB] United Kingdom ............... 9112867

[51] Int. Cl.5 .............................................. G08B 21/00
[52] U.S. Cl. ................................... 340/654; 340/635; 324/133
[58] Field of Search ............... 340/635, 644, 654, 656, 340/638, 639; 324/133

[56] References Cited

U.S. PATENT DOCUMENTS

| | | | |
|---|---|---|---|
| 3,201,650 | 8/1965 | Schultz | 317/23 |
| 4,530,027 | 7/1985 | Berger | 361/92 |
| 4,575,718 | 3/1986 | Ludowyk | 340/644 X |
| 4,777,479 | 10/1988 | Hinckley | 340/644 |
| 4,823,021 | 4/1989 | Shimada et al. | 307/112 |

FOREIGN PATENT DOCUMENTS

| | | |
|---|---|---|
| 1331878 | 9/1973 | United Kingdom . |
| 2133192 | 7/1984 | United Kingdom . |
| 2228353 | 8/1990 | United Kingdom . |

*Primary Examiner*—Jeffery A. Hofsass
*Attorney, Agent, or Firm*—Fitzpatrick, Cella, Harper & Scinto

[57] ABSTRACT

A power fail detection circuit in electrically powered apparatus comprises a power switch for the apparatus and power detection means responsive to the absence of electrical power from the power switch to provide a power fail indication. The power switch has at least one double throw pole, switchable between power-ON and power-OFF terminals, and the circuit includes switch position detection means connected to the power-OFF terminal and which is responsive to the power switch being in the power-OFF position to disable the power fail indication.

7 Claims, 1 Drawing Sheet

POWER FAIL DETECTION CIRCUIT

FIELD OF THE INVENTION

This invention relates to power fail detection circuits for use with electrically powered apparatus of a kind which have a local switch, which ON/OFF controls the power supplied to the apparatus.

BACKGROUND OF THE INVENTION

In many situations electrically powered apparatus fulfill important and vital functions and that they operate continuously over predefined time periods is crucial. The time period which the apparatus is required to operate is generally controlled manually by an ON/-OFF switch situated on or near the apparatus. However, on occasions, premature interruptions to the power supply may occur for many and various reasons including, for example, a disconnection in the power supply leads from the power source to the apparatus. Such interruptions may be extremely serious, particularly if a person's life depends on the continuous operation of the apparatus.

Accordingly, prior art systems provide a power fail detection circuit which enables an alarm each time a power fail is detected. The power fail is enabled each time the apparatus is switched off and so must be switched off at the same time.

SUMMARY OF THE INVENTION

It is an object of the present invention to provide an improved power fail detection system which is small, simple and cheap to make, and easy to install.

The invention provides a power fail detection circuit in electrically powered apparatus, comprising a power switch for the apparatus and power detection means responsive to the absence of electrical power from the power switch to provide a power fail indication, wherein the power switch has at least one double throw pole, switchable between power-ON and power-OFF terminals, and the circuit includes switch position detection means connected to the power-OFF terminal and responsive to the power switch being in the power-OFF position to disable the power fail indication.

Accordingly, the invention provides a means of detecting a power failure at the apparatus so that a signal is only produced in response to an event whereby the apparatus ceases to operate other than by way of ON/-OFF controlling the switch.

In a preferred embodiment, the switch has two double throw poles switchable between power-ON and power-OFF terminals, and the switch position detection means is connected to both the power-OFF terminals, so that the detection circuit is dissociated from the power supply when the switch is on. Thus, when power is supplied the detection circuit is advantageously isolated from the power supply by the switch, enabling the power supply to operate as normal. The detection circuit then detects an open circuit at the switch. When the power supply is a mains power supply, this embodiment advantageously allows switching of both live and neutral power lanes, which is required by certain regulatory bodies in some cases of mains powered medical equipment.

In a preferred embodiment, the or each pole is connected directly to the apparatus and the or each power-ON terminal is arranged for connection to the power supply. Advantageously the switch position detection means is isolated from the power supply when the switch is in the power-OFF position.

Preferably, the detection circuit is responsive to a current path connected between the power-OFF terminals when the switch is in the power-OFF position. This current path may be provided, for example, by the primary winding of a transformer at the power input side of the apparatus. In one embodiment of the present invention the switch detection means includes a source of direct current for detecting a resistive path connected between the power-OFF terminals when the switch is in the power-OFF position. Alternatively, the switch position detection means includes a source of alternating current for detecting a resistive or reactive path connected between the power-OFF terminals when the switch is in the power-OFF position.

Also according to the present invention, there is provided a power switch in electrically powered apparatus comprising at least one double throw pole switchable between power-ON and power-OFF terminals, wherein the or each pole is connected directly to the apparatus and the or each power-ON terminal is arranged for connection to the power supply.

Thus the invention provides a switch arrangement in which the power-OFF terminal is connected to the input of the apparatus when the switch is in the power-OFF position so that the power-OFF terminal(s) serve as input or output terminals of the apparatus which are then to be used for some other purpose, such as instrumentation for testing or measuring properties of the apparatus at the input, detecting the switch position or applying an alternative source of power to the apparatus or receiving power from the apparatus.

BRIEF DESCRIPTION OF THE DRAWINGS

Examples of embodiments of the present invention will now be described with reference to the drawings, in which.

DETAILED DESCRIPTION OF THE INVENTION

Figure 1:
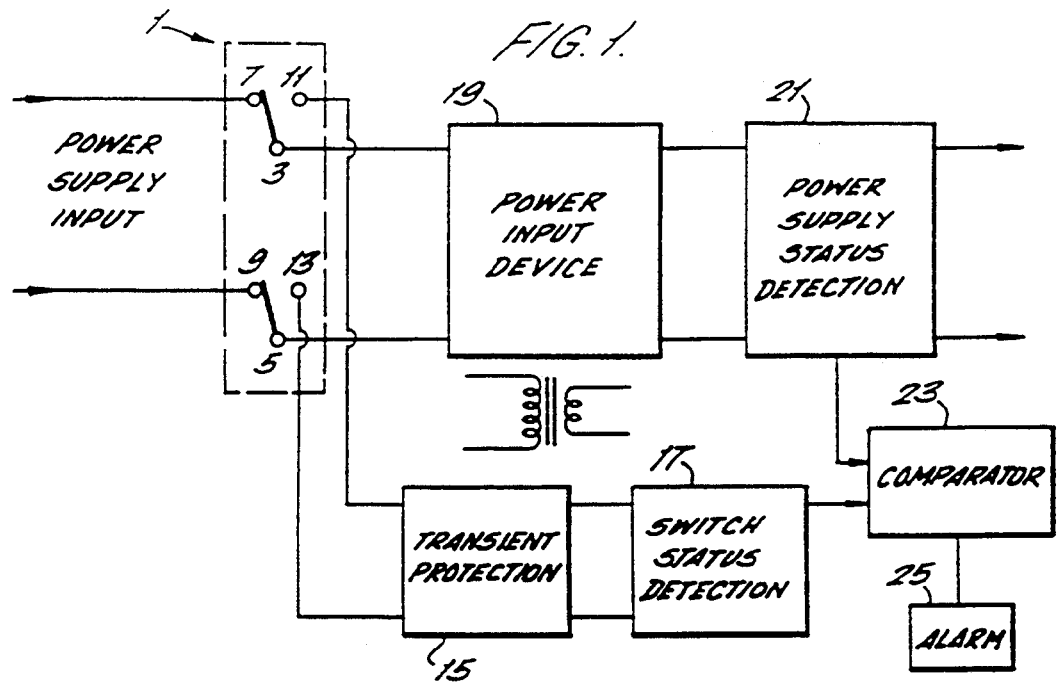
FIG. 1 shows a block diagram of a preferred embodiment of the present invention.

Referring to FIG. 1, a power fail detection circuit is shown comprising a double pole, double throw (DPDT) switch 1, connected between a power supply and an electrically powered apparatus. The respective double throw poles 3 and 5 are switchable between the power-ON terminals 7 and 9, and the power-OFF terminals 11 and 13. A switch position detection circuit 17 is connected to the power-OFF terminals 11 and 13 via a transient protection circuit 15. When the switch 1 is ON (i.e. poles 3 and 5 are connected to terminals 7 and 9) the power supply is connected through the switch 1 to a power input device 19 which, for example, may be a transformer. A power detection circuit 21 is connected to the other side of the power input device 19. In this mode, the switch position detection circuit 17 is isolated from the power supply and detects an open circuit between terminals 11 and 13. Hence, this arrangement allows safe isolation between the mains supply and the detecting circuit. At the same time it provides a measurable circuit parameter by which the detection circuit 17 can identify the switch position when the switch is in the ON position.

The switch status detection circuit 17 is preferably powered by a local supply, and may be either a direct or alternating current source (not shown). The switch position detection circuit 17 then outputs a signal corresponding to the switch position, either to control the power detection circuit 21, or serve as an input to a comparator 23. In the latter arrangement, the power detection circuit 21 outputs a signal to the comparator 23, corresponding to the power status. In the event that the switch 1 is ON but the power supply is OFF, appropriate signals at the comparator 23 will cause the comparator to output a signal for enabling a power fail indication such as an alarm 25.

In the second switch mode, i.e. when the switch is OFF, poles 3 and 5 will be connected to the power-OFF terminals 11 and 13, connecting the switch position detection circuit 17 across the power input device 19. If the power input device is a transformer, then poles 3 and 5 will be connected across the primary winding. Hence, the primary winding will provide a current path between the power-OFF terminals when the switch is OFF. Thus, in changing the switch from the ON position to the OFF position, the impedance detected by the switch position detection circuit 17 between terminals 11 and 13 will change from open circuit impedance to the impedance across the primary winding. The switch position detection circuit 17 will then output a signal corresponding to the switch status. This signal will be significantly different in magnitude from that when the switch is in the ON status and is used to disable a power fail indication. If a comparator 21 is used, this different signal, in combination with the signal generated by the power detection circuit 21, will control the comparator so that no signal is generated for activating the alarm 25.

Figures 2A, 2B:
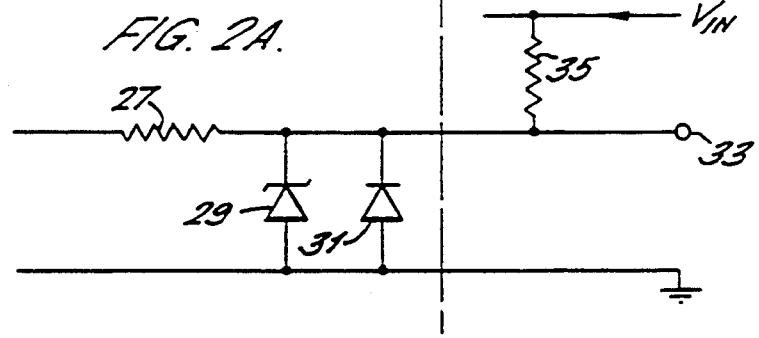
FIG. 2A shows a transient protection circuit for use with the preferred embodiment.
FIG. 2B shows a circuit diagram of a detection circuit for use with the preferred embodiment.

FIGS. 2A and 2B, show a transient protection circuit 15 and a switch status detection circuit 17 respectively. A current limiting resistor 27 for series connection with the primary/winding of the transformer when the switch is OFF, protects the circuit. A zener diode 29 is connected between the detection circuit side of resistor 27 and ground, and limits the positive voltage at the output of the detection circuit 33. A low forward voltage diode 31 is connected as shown, to limit the negative voltage at output 33. The detection circuit includes a resistor 35 connected between a local supply (i.e. a battery) and output 33, and allows significant voltage swing at the output with operation of the switch. The comparator 23 is preferably a logic comparator.

Figure 3:
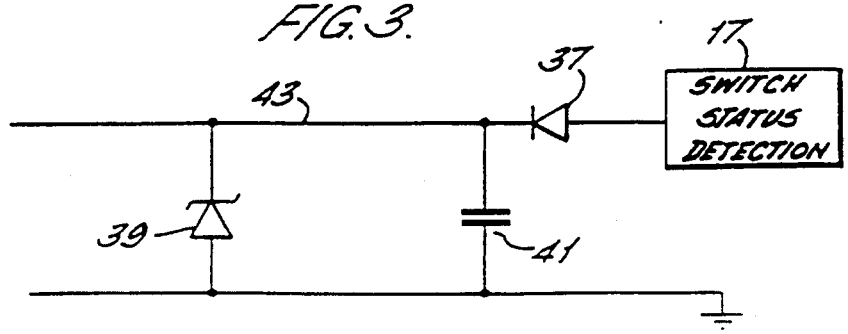
FIG. 3 shows an alternative transient protection circuit.

FIG. 3 shows an alternative transient protection circuit. Diode 37 protects the logic circuit 17. A transient voltage suppressor 39 and a capacitor 41 connected across the power-OFF terminals limits the magnitude of the voltage on line 43. The capacitor in this circuit is optional.

Although the power fail detection circuit has been described with use of a double pole, double throw switch, a switch having only one double throw pole either 3 or 5, may also be used, provided it is connected so that operation of the switch produces a detectable change in a circuit parameter in the switch detection circuit.

I claim:

1. A power fail detection circuit in electrically powered apparatus comprising a power switch for the apparatus and power detection means responsive to the absence of electrical power from the power switch to provide a power fail indication, wherein
   the power switch has at least one double throw pole, switchable between power-ON and power--OFF terminals, and the circuit includes switch position detection means connected to the power-OFF terminal and responsive to the power switch being in the power-OFF position to disable the power fail indication.

2. A power fail detection circuit as claimed in claim 1, wherein the switch has a second double throw pole switchable between respective further power-ON and power-OFF terminals, and the switch position detection means is connected to both the power-OFF terminals, and is responsive to a current path connected between the power-OFF terminals when the switch is in the power-OFF position.

3. A power fail detection circuit as claimed in claim 2 wherein the or each pole is connected directly to the apparatus and each power-ON terminal is arranged for connection to the power supply.

4. A power fail detection circuit as claimed in claim 3 including a transformer winding connected between said power-OFF terminals when the switch is in the power-OFF position to provide said current path.

5. A power fail detection circuit as claimed in claim 2, wherein the switch position detection means includes a source of direct current for detecting a resistance path connected between the power-OFF terminals when the switch is in the power-OFF position.

6. A power fail detection circuit as claimed in claim 2, wherein the switch position detection means includes a source of alternating current for detecting a resistive path connected between the power-OFF terminals when the switch is in the power-OFF position.

7. A power fail detection circuit as claimed in claim 2, wherein the switch position detection means includes a source of alternating current for detecting a reactive path connected between the power-OFF terminals when the switch is in the power-OFF position.

* * * * *

UNITED STATES PATENT AND TRADEMARK OFFICE
CERTIFICATE OF CORRECTION

PATENT NO. : 5,376,920
DATED : December 27, 1994
INVENTOR(S) : Baily

It is certified that error appears in the above-indentified patent and that said Letters Patent is hereby corrected as shown below:

COLUMN 1:

Line 62, "lanes," should read --lines--.

COLUMN 4:

Line 33, "the or" should be deleted.

Signed and Sealed this

Sixth Day of June, 1995

Attest:

BRUCE LEHMAN

Attesting Officer       Commissioner of Patents and Trademarks